US012684790B2

(12) United States Patent
Derrickson et al.

(10) Patent No.: US 12,684,790 B2
(45) Date of Patent: Jul. 14, 2026

(54) BIPOLAR TRANSISTORS

(71) Applicant: GlobalFoundries U.S. Inc., Malta, NY (US)

(72) Inventors: Alexander M. Derrickson, Saratoga Springs, NY (US); Kaustubh Shanbhag, Slingerlands, NY (US); Vibhor Jain, Clifton Park, NY (US); Judson R. Holt, Ballston Lake, NY (US)

(73) Assignee: GLOBALFOUNDRIES U.S. Inc, Malta, NY (US)

( * ) Notice: Subject to any disclaimer, the term of this patent is extended or adjusted under 35 U.S.C. 154(b) by 361 days.

(21) Appl. No.: 18/368,412

(22) Filed: Sep. 14, 2023

(65) Prior Publication Data

US 2025/0098190 A1     Mar. 20, 2025

(51) Int. Cl.
| | |
|---|---|
| H10D 10/80 | (2025.01) |
| H10D 10/01 | (2025.01) |
| H10D 62/13 | (2025.01) |
| H10D 62/17 | (2025.01) |
| H10D 62/822 | (2025.01) |
| H10D 62/852 | (2025.01) |

(52) U.S. Cl.
CPC ......... H10D 10/821 (2025.01); H10D 10/021 (2025.01); H10D 10/80 (2025.01); H10D 62/133 (2025.01); H10D 62/177 (2025.01); H10D 62/822 (2025.01); *H10D 62/852* (2025.01)

(58) Field of Classification Search
CPC .. H10D 10/821; H10D 10/021; H10D 62/852; H10D 10/80; H10D 62/133; H10D 62/177; H10D 62/115; H10D 62/136; H10D 10/054; H10D 10/221; H10D 62/161; H10D 62/184; H10D 62/82
See application file for complete search history.

(56) References Cited

U.S. PATENT DOCUMENTS

| | | | |
|---|---|---|---|
| 5,298,786 A | 3/1994 | Shahidi et al. | |
| 5,552,624 A | 9/1996 | Skotnicki et al. | |
| 6,949,764 B2 | 9/2005 | Ning | |
| 9,825,157 B1 * | 11/2017 | Jain | H10D 62/822 |
| 10,014,397 B1 | 7/2018 | Jain et al. | |
| 2010/0244143 A1 | 9/2010 | Yang et al. | |
| 2014/0001557 A1 * | 1/2014 | Mishra | H10D 64/111 |
| | | | 257/E21.409 |
| 2018/0175180 A1 * | 6/2018 | Jain | H10D 64/281 |

(Continued)

FOREIGN PATENT DOCUMENTS

EP          4184588 A1     5/2023

OTHER PUBLICATIONS

The Extended Search Report and Opinion dated Nov. 12, 2024 in EP Application No. 24160165.7-1211 12 pages.

*Primary Examiner* — Christine S. Kim
*Assistant Examiner* — Tien Tran
(74) *Attorney, Agent, or Firm* — Francois Pagette; Andrew M. Calderon; Calderon Safran & Wright P.C.

(57) ABSTRACT

The present disclosure relates to semiconductor structures and, more particularly, to bipolar transistors and methods of manufacture. The structure includes: a collector; a base region above the collector; an emitter laterally connecting to the base region; and an extrinsic base connecting to the base region.

20 Claims, 6 Drawing Sheets

(56) References Cited

U.S. PATENT DOCUMENTS

| | | | |
|---|---|---|---|
| 2021/0134987 A1* | 5/2021 | Yang | H10D 64/231 |
| 2023/0062194 A1 | 3/2023 | Holt et al. | |
| 2023/0067486 A1 | 3/2023 | Derrickson et al. | |
| 2023/0178638 A1* | 6/2023 | Cai | H10D 10/821 |
| | | | 257/197 |
| 2023/0197787 A1* | 6/2023 | Cai | H10D 10/061 |
| | | | 257/197 |
| 2024/0105793 A1* | 3/2024 | Willard | H10D 30/0323 |

* cited by examiner

BIPOLAR TRANSISTORS

This invention was made with government support under contract number HR0011-20-3-0002 awarded by Defense Advanced Research Projects Agency (DARPA T-Music). The government has certain rights in the invention.

BACKGROUND

The present disclosure relates to semiconductor structures and, more particularly, to bipolar transistors and methods of manufacture.

A heterojunction bipolar transistor (HBT) is a type of bipolar junction transistor (BJT) which uses differing semiconductor materials for an emitter region and base region, creating a heterojunction. The HBT can handle signals of very high frequencies, up to several hundred GHz. The HBT is commonly used in ultrafast circuits, mostly radio frequency (RF) systems, and in applications requiring a high power efficiency, such as RF power amplifiers in cellular phones.

SUMMARY

In an aspect of the disclosure, a structure comprises: a collector; a base region above the collector; an emitter laterally connecting to the base region; and an extrinsic base connecting to the base region.

In an aspect of the disclosure, a structure comprises: a semiconductor region of a first conductivity type; a sub-collector above the semiconductor region and comprising a second conductivity type; a base region above the sub-collector, and further comprises the first conductivity type; a gate structure above the base region; an emitter on a first side of the gate structure; and an extrinsic base on a second side of the gate structure.

In an aspect of the disclosure, a method comprises: forming a collector; forming a base region above the collector; forming an emitter laterally connecting to the base region; and forming an extrinsic base connecting to the base region.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to bipolar transistors and methods of manufacture. More specifically, the bipolar transistors may be lateral-vertical bipolar transistors formed under a gate structure. Advantageously, the lateral-vertical bipolar transistors disclosed herein exhibit high performance characteristics, e.g., improved fT/Fmax.

In specific embodiments, the lateral-vertical bipolar transistors may be a lateral-vertical SiGe heterojunction bipolar transistor (HBT). The HBT comprises an emitter and extrinsic base are laterally connected to a SiGe base and the collector may be vertically below the SiGe base. A gate structure may separate the emitter from extrinsic base. In operation, it is possible to modulate the HBT by biasing the gate structure. The emitter and extrinsic base may be, for example, single crystalline semiconductor material.

The bipolar transistors of the present disclosure can be manufactured in a number of ways using a number of different tools. In general, though, the methodologies and tools are used to form structures with dimensions in the micrometer and nanometer scale. The methodologies, i.e., technologies, employed to manufacture the bipolar transistors of the present disclosure have been adopted from integrated circuit (IC) technology. For example, the structures are built on wafers and are realized in films of material patterned by photolithographic processes on the top of a wafer. In particular, the fabrication of the bipolar transistors uses three basic building blocks: (i) deposition of thin films of material on a substrate, (ii) applying a patterned mask on top of the films by photolithographic imaging, and (iii) etching the films selectively to the mask. In addition, pre-cleaning processes may be used to clean etched surfaces of any contaminants, as is known in the art. Moreover, when necessary, rapid thermal anneal processes may be used to drive-in dopants or material layers as is known in the art.

Figure 1:
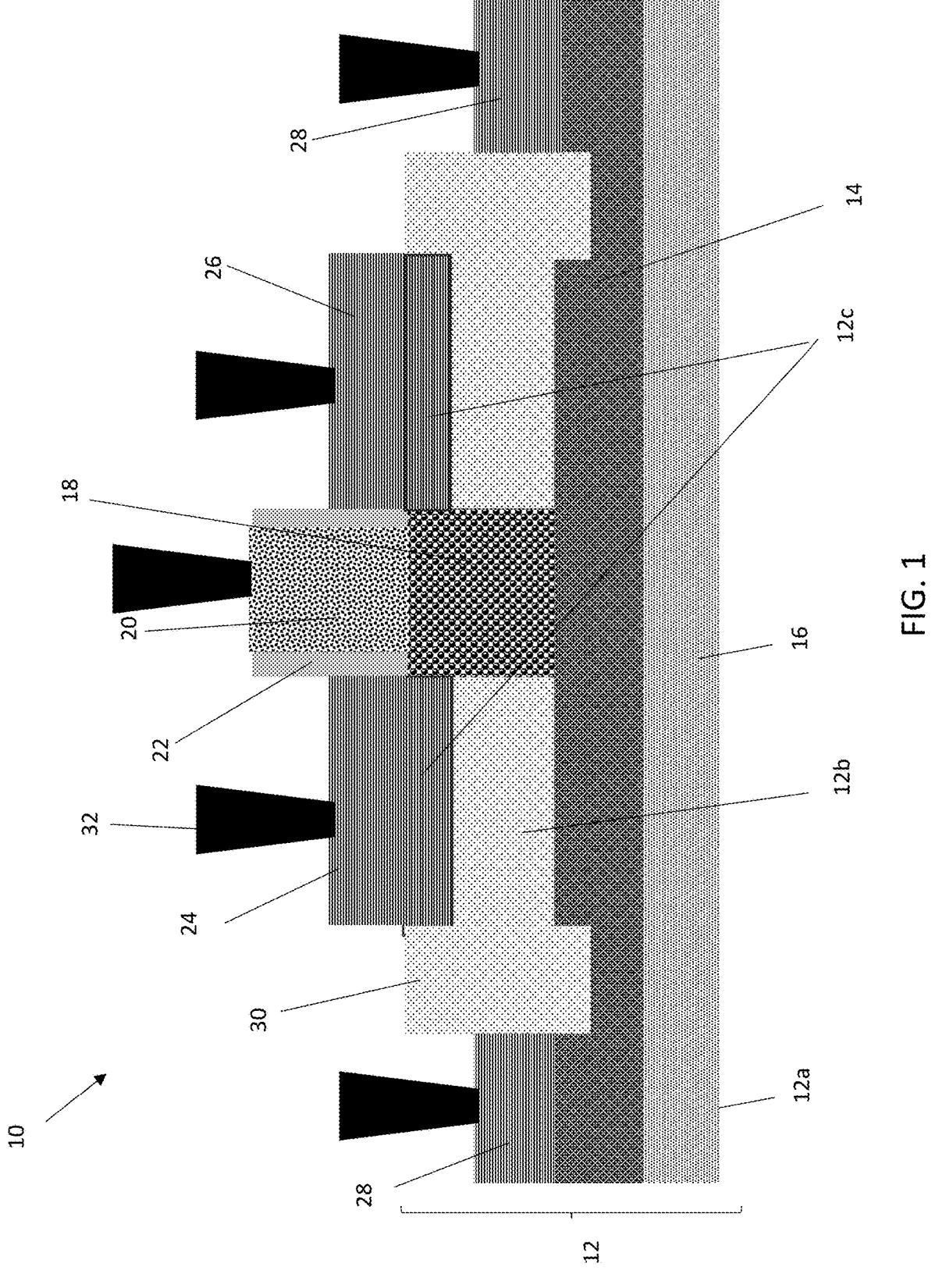
FIG. 1 shows a transistor and respective fabrication processes in accordance with aspects of the present disclosure.

FIG. 1 shows a transistor and respective fabrication processes in accordance with aspects of the present disclosure. In embodiments, the transistor 10 may be a four terminal bipolar transistor. In further embodiments, the transistor 10 may be a lateral-vertical HBT comprising a base 18 vertically above a sub-collector 14 and an emitter 26 laterally connected to the base 18. An extrinsic base 24 may also be laterally connected to the base 18 on an opposite end of a gate structure 20, with relation to the emitter 26. The gate structure 20 separates the emitter 26 from the extrinsic base 24, and may be biased to modulate the HBT. The emitter 26 and the extrinsic base 24 may be at a same level of the device and may be separated by the gate structure 20.

More specifically, the transistor 10 includes a substrate 12 comprising, for example, semiconductor-on-insulator (SOI) technology. From bottom to top, the semiconductor substrate 12 includes a handle substrate 12a, a buried insulator layer 12b and a top semiconductor layer 12c. The handle substrate 12a provides mechanical support to the buried insulator layer 12b and the top semiconductor layer 12c. The handle substrate 12a may also contain a collector/sub-collector region 14, In embodiments, the sub-collector region 14 may comprise an N-well. The N-well may be formed by a conventional ion implantation process, as described herein. The n-type dopants used in the ion implantation process may be, e.g., Arsenic (As), Phosphorus (P) and Antimony (Sb), among other suitable examples. It should be understood by those of skill in the art that an annealing process may be performed to drive in any of the dopants into the handle substrate 12a and/or the top semiconductor layer 12c. In a PNP device, the sub-collector region 14 may be a P-well and the handle substrate 12a may be an n-type substrate or have a n-type isolation region around the p-well.

The handle substrate 12a and the top semiconductor layer 12c may include a semiconductor material such as, for example, Si, SiGe, SiC, SiGeC, a III-V compound semiconductor, an II-VI compound semiconductor or any combinations thereof. In specific embodiments, the handle substrate 12a may preferably be a P-type Si substrate. The buried insulator layer 12b may include a dielectric material such as silicon dioxide, silicon nitride, silicon oxynitride, boron nitride or a combination thereof. In one embodiment, the buried insulator layer 12b may be a buried oxide layer (BOX) formed by a deposition process, such as chemical vapor deposition (CVD), plasma enhanced chemical vapor deposition CVD (PECVD) or physical vapor deposition (PVD). In another embodiment, the buried insulator layer 12b may be formed using a thermal growth process, e.g., thermal oxidation, or by implanting oxygen atoms into a bulk semiconductor substrate and thereafter annealing the structure.

Typically, each of the handle substrate 12a and the top semiconductor layer 12c comprises a single crystalline semiconductor material, such as, for example, single crystalline silicon (Si). The handle substrate 12a and top semiconductor layer 12c may comprise any suitable crystallographic orientation (e.g., a (100), (110), (111), or (001) crystallographic orientation). The top semiconductor layer 12c can be formed by a deposition process, e.g., CVD or PECVD, or a smart cut process as is known in the art such that no further explanation is required for a complete understanding of the present invention.

Still referring to FIG. 1, a base region 18 may be formed within the buried insulator layer 12b and top semiconductor layer 12c. The base region 18 may contact the handle substrate 12a and, more specifically, electrically connect to the sub-collector region 14. The base region 18 may be an epitaxially grown semiconductor material which is vertically above the sub-collector region 14. The base region 18 may be p-type SiGe material, which is epitaxially grown from the handle substrate 12a with an in-situ p-type doping, e.g., boron. The combination of the base region 18, sub-collector region 14 and the handle substrate 12a will form a parasitic PNP device.

In alternate embodiments for forming a PNP device, the base region 18 may be n-type SiGe material, which is epitaxially grown from the handle substrate 12a with an in-situ n-type doping, e.g., arsenic. In this embodiment, the combination of the base region 18, sub-collector region 14 and the handle substrate 12a will form a parasitic NPN device.

A gate structure 20 may be formed vertically above the base region 18. In more specific embodiments, the gate structure 20 may be formed on the surface of the base region 18, e.g., p-type SiGe material. The gate structure 20 may be, for example, a dielectric material touching the base region 18 and a polysilicon material above the dielectric layer which has a width that is the same, smaller or larger than the base region 18. Sidewall spacers 22 may be formed on the sidewalls of the gate structure 20. In embodiments, the sidewall spacers 22 may be an insulator material such as, e.g., oxide and/or nitride materials.

The gate structure 20 may be provided between an extrinsic base 24 and an emitter 26. In this way, the extrinsic base 24 and the emitter 26 are laterally separated and isolated from one another by the gate structure 20.

In embodiments, the extrinsic base 24 may be a p-type semiconductor material formed by an epitaxial growth process on a side of the gate structure 20, e.g., adjacent to the sidewall spacers 22, and directly above the buried insulator layer 12b. The extrinsic base 24 may also be laterally connected to the base region 18, e.g., p-type SiGe material. The p-type semiconductor material may be p-doped Si.

The top semiconductor layer 12a may also be used to form part of the extrinsic base 24, which contacts the base region 18. For example, in embodiments, the extrinsic base 24 may be epitaxially grown from the top semiconductor layer 12a. In this way, the semiconductor layer 12a may become p-doped by an in-situ doping process during the epitaxial growth process of the extrinsic base 24.

Moreover, the emitter 26 may be an n-type emitter formed by an epitaxial growth process on another side of the gate structure 20, e.g., adjacent to the sidewall spacers 22, and directly above the buried insulator layer 12b. The emitter 26 may also be laterally connected to the base region 18, e.g., p-type SiGe material, below the gate structure 20. The top semiconductor layer 12a may form part of the emitter 26. In embodiments, the emitter 26 may be epitaxially grown from the top semiconductor layer 12a. In this way, the semiconductor layer 12a may become n-doped by an in-situ doping process during the epitaxial growth process of the emitter 26. Thus, the top semiconductor layer 12a may be used to form both the extrinsic base 24 and the emitter 26.

Figure 4A:
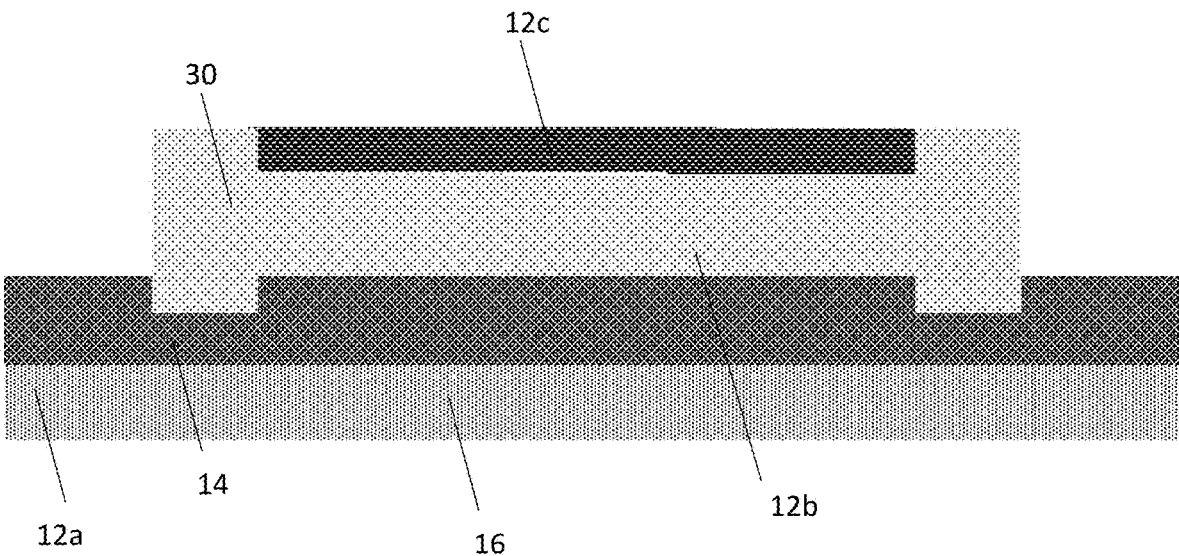
FIGS. 4A-4E show fabrication processes of manufacturing a transistor in accordance with aspects of the present disclosure.

Collector contacts 28 may be formed by an epitaxial growth process on sides of the base region 18. The collector contacts 28 may electrically connect to the collector region 16. The collector contacts 28 may be separated from the base region 18 by both the buried insulator layer 12b and shallow trench isolation structures 30. In embodiments, the shallow trench isolation structures 30 may be formed by conventional lithography, etching and deposition methods known to those of skill in the art as described with respect to FIG. 4A.

FIG. 1 further shows contacts 32 formed to the collector contacts 28, extrinsic base 24, the emitter 26 and the gate structure 20. Prior to forming the contacts 32, a silicide contact may be formed on the collector contacts 28, extrinsic base 24, the emitter 26 and, optionally, the gate structure 20. As should be understood by those of skill in the art, the silicide process begins with deposition of a thin transition metal layer, e.g., nickel, cobalt or titanium, over fully formed and patterned semiconductor devices (e.g., collector contacts 28, extrinsic base 24, the emitter 26 and the gate structure 20). After deposition of the material, the structure is heated allowing the transition metal to react with exposed silicon (or other semiconductor material as described herein) in the active regions of the semiconductor device (e.g., collector contacts 28, extrinsic base 24, the emitter 26 and the gate structure 20) forming a low-resistance transition metal silicide. Following the reaction, any remaining transition metal is removed by chemical etching, leaving silicide contacts in the active regions of the device.

Figure 2:
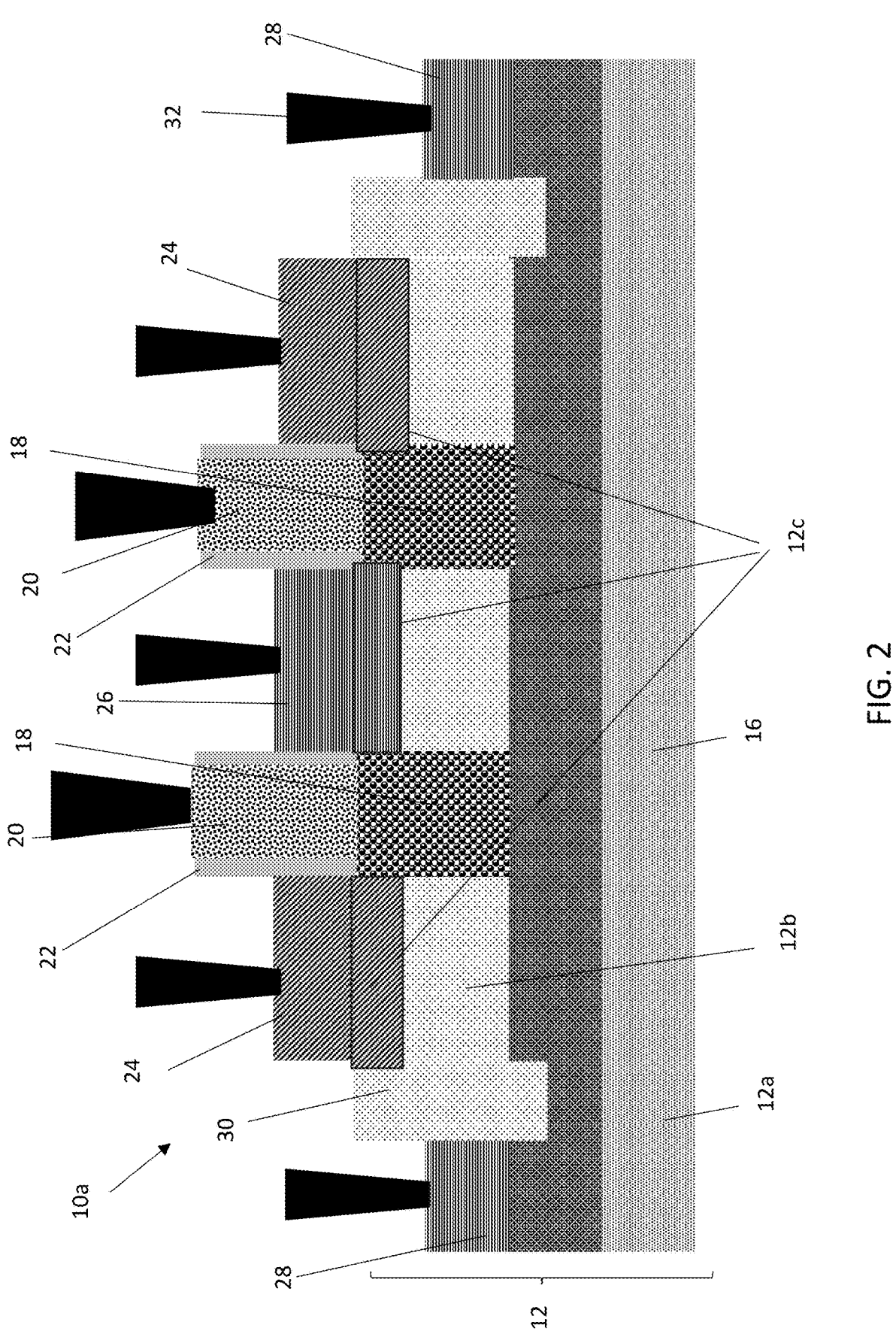
FIG. 2 shows a transistor in accordance with additional aspects of the present disclosure.

FIG. 2 shows a transistor in accordance with additional aspects of the present disclosure. In embodiments, the transistor 10a may be a mirrored version of the transistor 10 of FIG. 1. For example, in this embodiment, two gate structures 20 may be provided above two base regions 18, e.g., p-type SiGe material, with a single emitter region 26 between the gate structures 20 and two base regions 24 on opposing sides of the gate structures 20. The remaining features of the transistor 10a are similar to the transistor 10 of FIG. 1 such that no further explanation is required for a complete understanding of the present disclosure.

Figure 3A:
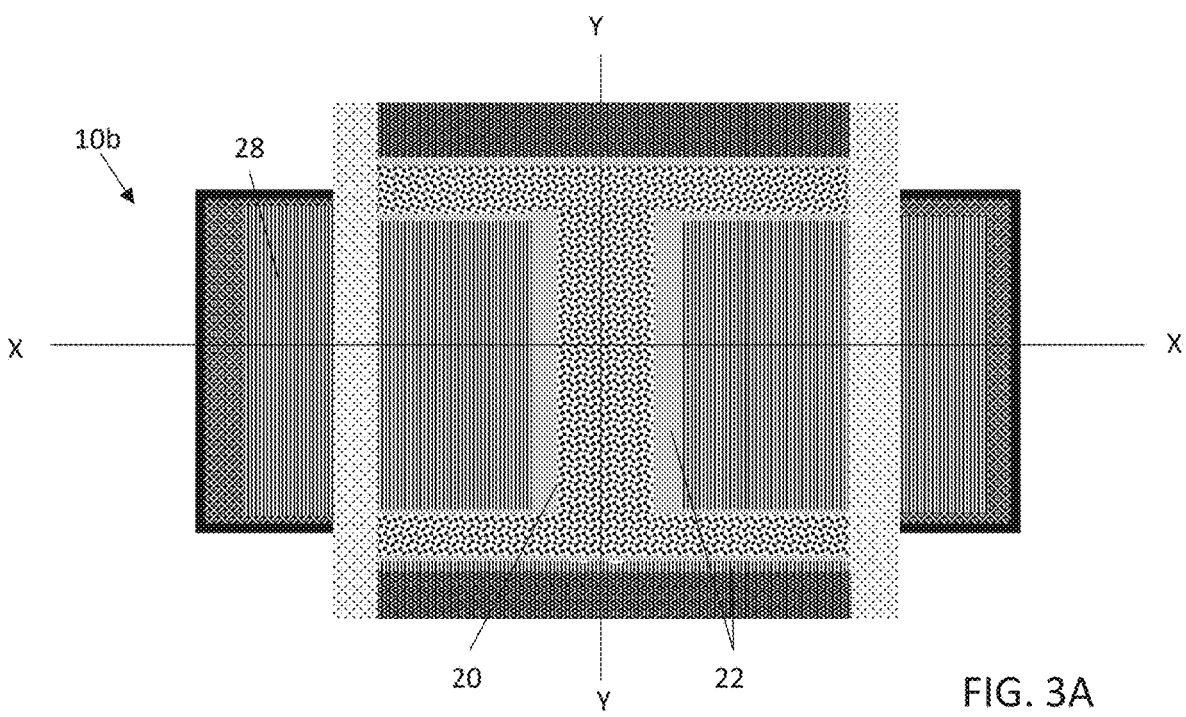
FIGS. 3A-3C show a transistor in accordance with further aspects of the present disclosure.
Figure 3B:
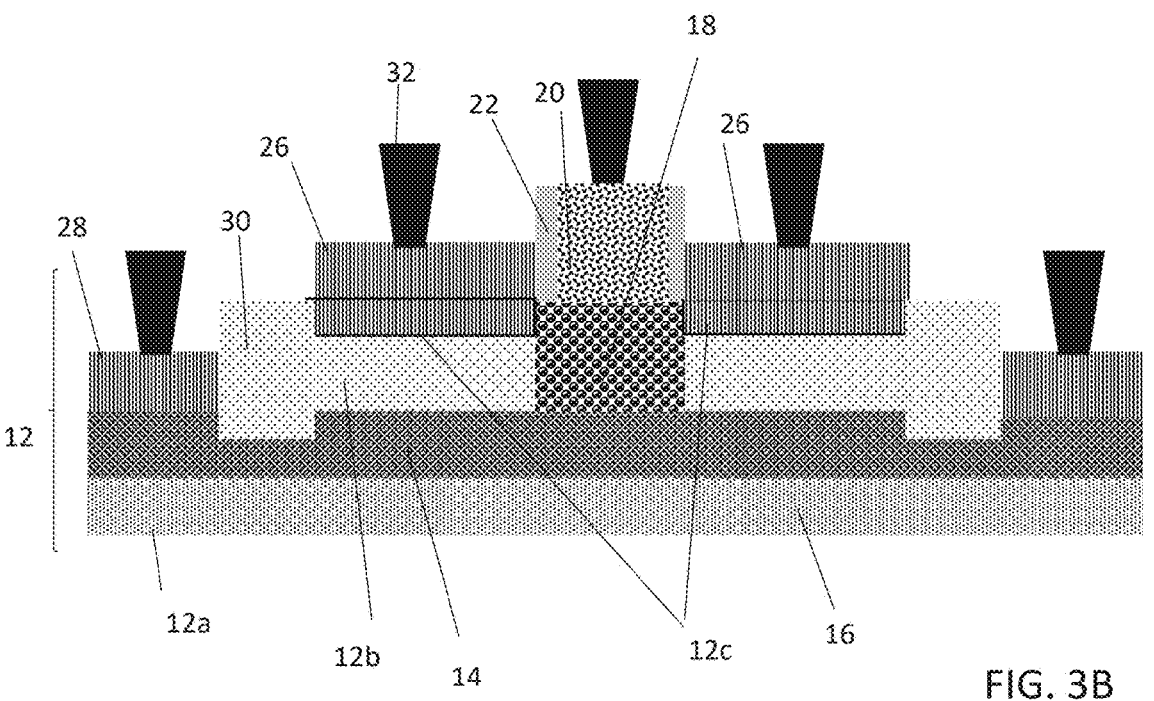
Figure 3C:
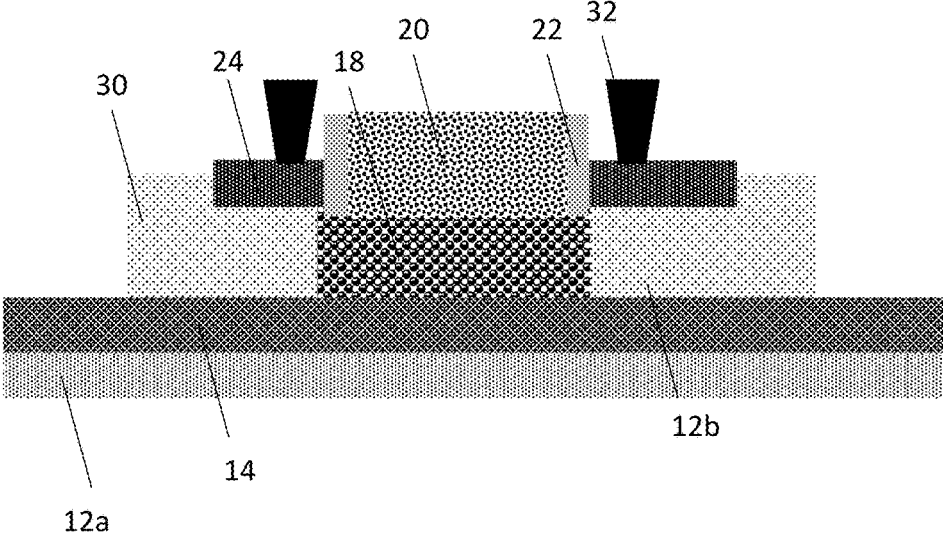

FIGS. 3A-3C show a transistor in accordance with further aspects of the present disclosure. FIG. 3A shows a top view of the transistor 10b; whereas FIG. 3B shows a cross-sectional view of the transistor along line X-X of FIG. 3A and FIG. 3C shows a cross-sectional view of the transistor along line Y-Y of FIG. 3A. In this embodiment, the gate structure 20 is an "I" shaped structure with sidewall spacers 22 thereabout. As shown in the cross-sectional view along line X-X of FIG. 3B, the emitter 26 is provided on both sides of the gate structure 20. In the cross-sectional view along line Y-Y of FIG. 3A, the extrinsic base 24 is provided on both ends of the gate structure 20. The remaining features are similar to the transistor 10 of FIG. 1 such that no further explanation is required for a complete understanding of the present disclosure.

FIGS. 4A-4E show fabrication processes of manufacturing a transistor in accordance with aspects of the present disclosure. FIG. 4 shows the substrate 12 comprising, for example, from bottom to top, the handle substrate 12a, the buried insulator layer 12b and the top semiconductor layer 12c. The handle substrate 12a includes a sub-collector region 14 which may comprise an N-well. The N-well may be formed by a conventional ion implantation process. For example, the N-well may be formed by introducing a concentration of a n-type dopant. In embodiments, a patterned implantation mask may be used to define selected areas exposed for the implantations. The implantation mask may include a layer of a light-sensitive material, such as an organic photoresist, applied by a spin coating process, pre-baked, exposed to light projected through a photomask, baked after exposure, and developed with a chemical developer. The implantation mask has a thickness and stopping power sufficient to block masked areas against receiving a dose of the implanted ions. The N-well is doped with n-type dopants, e.g., Arsenic (As), Phosphorus (P) and Sb, among other suitable examples.

In embodiments, the shallow trench isolation structures 30 may be formed by conventional lithography, etching and deposition methods known to those of skill in the art. For example, a resist formed over the buried insulator layer 12b is exposed to energy (light) and developed utilizing a conventional resist developer to form a pattern (opening). An etching process with a selective chemistry, e.g., reactive ion etching (RIE), will be used to transfer the pattern from the photoresist layer to the buried insulator layer 12b to form one or more trenches reaching to the underlying handle substrate 12a. Following the resist removal by a conventional oxygen ashing process or other known stripants, the insulator material (e.g., $SiO_2$) can be deposited by any conventional deposition processes, e.g., chemical vapor deposition (CVD) processes. Any residual material on the surface of the structure can be removed by conventional chemical mechanical polishing (CMP) processes.

In FIG. 4, the top semiconductor layer 12c and the buried insulator layer 12b may also be patterned to expose the underlying handle substrate 12a and, more specifically, the sub-collector region 14. The patterning may be conventional lithography and etching processes as already described herein.

Figure 4B:
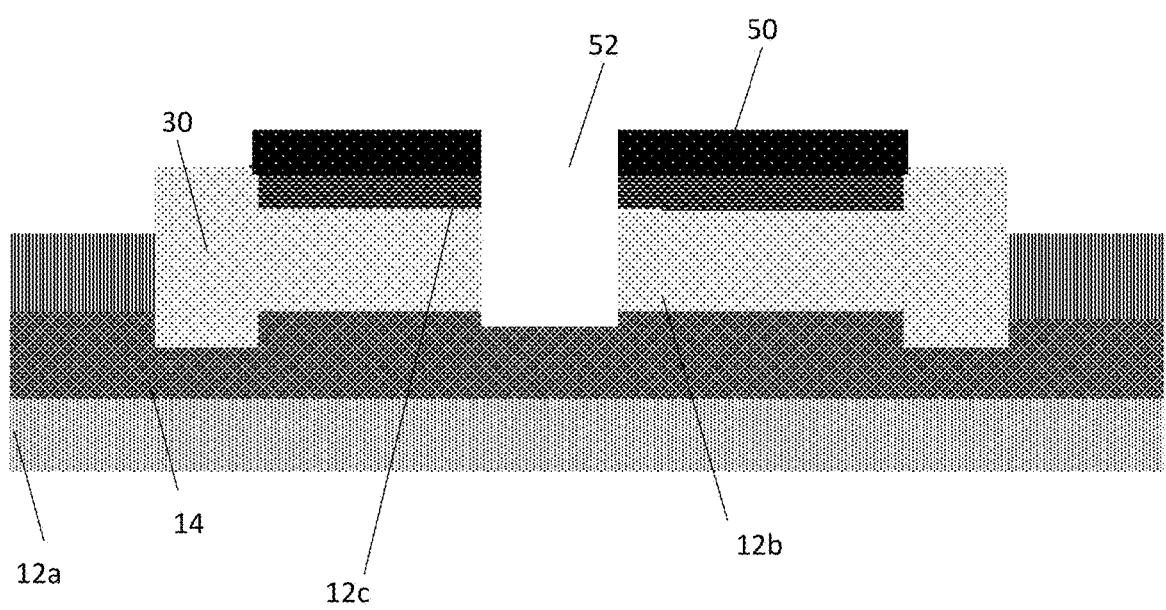

In FIG. 4B, a nitride hardmask 50 may be formed and patterned over the top semiconductor layer 12c. In this embodiment, the pattern comprises an opening that conforms to the size and shape of the base region. The pattern formed through the hardmask 50 is transferred to the buried insulator layer 12b and top semiconductor layer 12c by a conventional etching process, e.g., RIE, with a selective chemistry. In this way, a trench 52 is formed in the buried insulator layer 12b and top semiconductor layer 12c, exposing the underlying handle substrate 12a, e.g., sub-collector region 14.

Figure 4C:
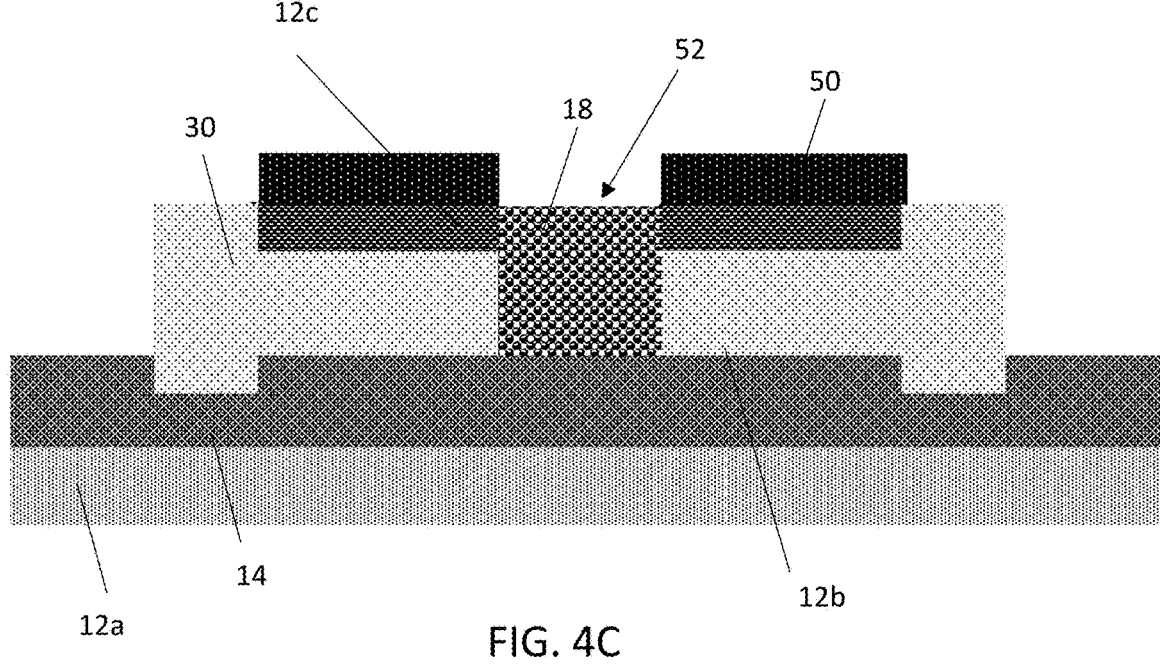

In FIG. 4C, the base region 18 may be formed in the trench 52. In embodiments, the base region 18 may be formed by an epitaxial growth process with an in-situ doping. For example, the epitaxial growth process may be a SiGe material grown from the handle substrate 12a, with an in-situ p-type doping. In embodiments, a boron spike may be provided at a surface of the p-type SiGe material.

Figure 4D:
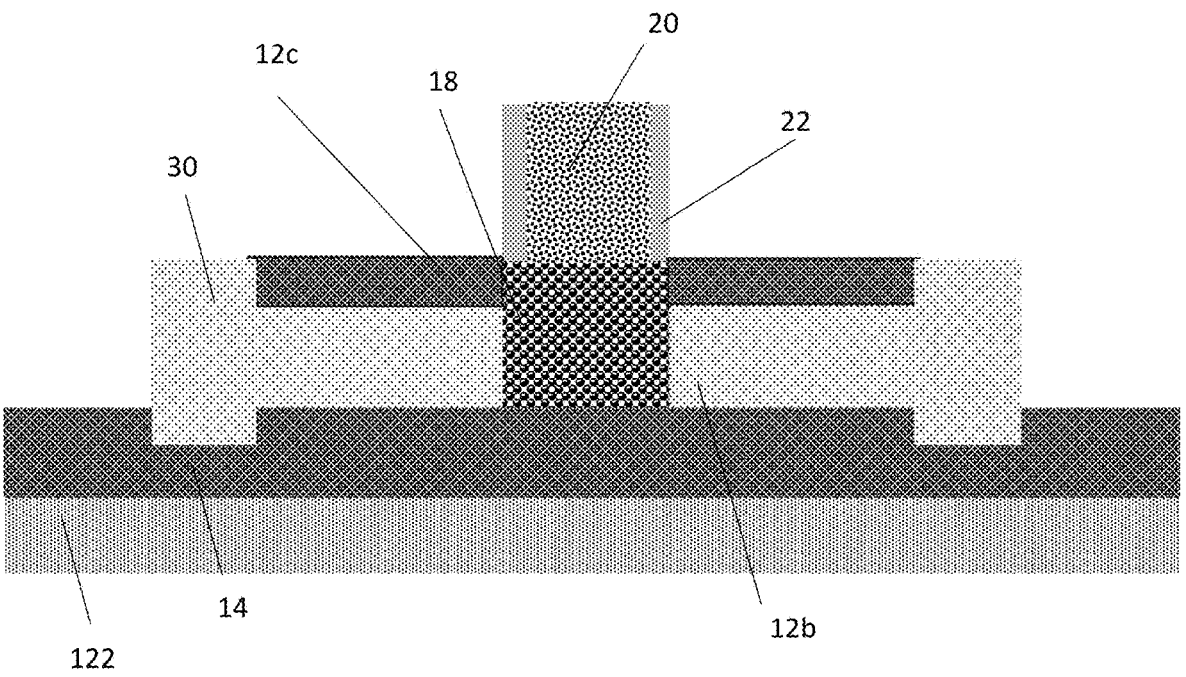

In FIG. 4D, the hardmask may be stripped and the gate structure 20 with sidewall spacers 22 may be formed over the base region 18. In embodiments, the gate structure 20 may be formed by a conventional deposition process, followed by a patterning process. For example, the gate structure 20 may be formed by a CVD process comprising, for example, depositing of a gate dielectric material and a gate electrode material. In embodiments, the gate dielectric material may be either a low-k dielectric material or a high-k dielectric material as is known in the art such that no further explanation is required for a complete understanding of the present disclosure. The gate electrode material may be a polysilicon material. A conventional patterning process as already described herein may be used to pattern the gate electrode material and the gate dielectric material. The gate 20 may have a width larger, smaller or of a same size as the base region 18.

Still referring to FIG. 4D, sidewall spacers 22 may be formed on sidewalls of the gate structure 20. The sidewall spacers 22 may be oxide and/or nitride material formed by a conventional deposition method, e.g., CVD, followed by an anisotropic etching process.

Figure 4E:
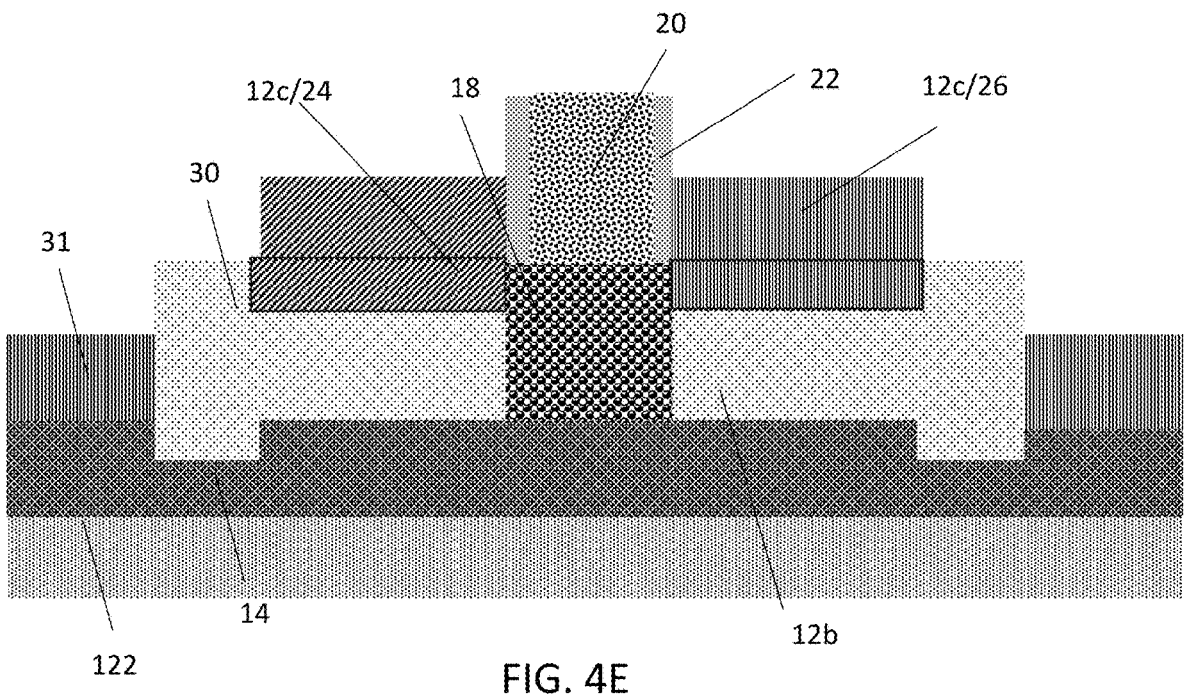

As further shown in FIG. 4E, the extrinsic base 24, the emitter 26 and the collector contacts 31 may be formed by conventional epitaxial growth processes as described herein. In embodiments, the emitter 26 and the collector contacts 28 may be formed at the same time using an in-situ n-type doping process; whereas the extrinsic base 24 may be formed with an in-situ p-type doping process. In alternative embodiments, the extrinsic base 24, the emitter 26 and the collector contacts 28 may be epitaxially grown at the same time, followed by an ion implantation process for the emitter 26 and the collector contacts 28 and a separate ion implantation process for the extrinsic base 24.

Referring back to FIG. 1, for example, the contacts 32 may be formed by conventional lithography, etching and deposition processes. For example, following the deposition of an interlevel dielectric material, trenches may be formed within the interlevel dielectric material to expose the extrinsic base 24, the emitter 26, the collector contacts 28 and the gate structure 20. Following a silicide process as described above, conductive material may be formed, e.g., deposited, within the trenches on the silicide contacts. Any excessive conductive material may be removed by a conventional chemical mechanical planarization (CMP) process. The conductive material may be aluminum, tungsten etc., with an optional liner such as TiN or TaN.

The bipolar transistors can be utilized in system on chip (SoC) technology. The SoC is an integrated circuit (also known as a "chip") that integrates all components of an electronic system on a single chip or substrate. As the components are integrated on a single substrate, SoCs consume much less power and take up much less area than multichip designs with equivalent functionality. Because of this, SoCs are becoming the dominant force in the mobile computing (such as in Smartphones) and edge computing markets. SoC is also used in embedded systems and the Internet of Things.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:
a collector;
a base region above the collector;
an emitter laterally connecting to the base region;
an extrinsic base connecting to the base region; and
a gate electrode which includes a bottom surface in direct contact with a top surface of the base region.

2. The structure of claim 1, wherein the extrinsic base is laterally connecting to the base region, and the emitter is between a plurality of gate structures.

3. The structure of claim 1, further comprising a gate structure above the base region, the gate structure separating the extrinsic base from the emitter, both the extrinsic base and the emitter are partly below the gate structure, and the base region directly contacting a top semiconductor layer comprising silicon.

4. The structure of claim 3, wherein the gate structure is a same width as the base region.

5. The structure of claim 3, wherein the gate structure is a different width than the base region.

6. The structure of claim 1, wherein the emitter and the extrinsic base are epitaxial semiconductor material on a top semiconductor layer of semiconductor-on-insulator technology.

7. The structure of claim 1, wherein, from a top down perspective, the gate structure is "I" shaped.

8. The structure of claim 7, wherein the emitter is at a side of the gate structure and the extrinsic base is at an end of the gate structure.

9. The structure of claim 1, further comprising:
a second base region above the collector;
a first gate structure on the base region; and
a second gate structure on the second base region,
wherein the emitter is between the first gate structure and the second gate structure, and laterally connects to the base region and the second base region.

10. The structure of claim 9, wherein the extrinsic base region is located on opposing sides of the first gate structure and the second gate structure with respect to the emitter.

11. A structure comprising:
a semiconductor region of a first conductivity type;
a sub-collector above the semiconductor region and comprising a second conductivity type;
a base region above the sub-collector, and further comprises the first conductivity type;
a gate structure above the base region;
an emitter on a first side of the gate structure; and
an extrinsic base on a second side of the gate structure,
wherein the emitter is on both sides of an "I" shape of the gate structure.

12. The structure of claim 11, wherein the emitter and the extrinsic base are separated from one another by the gate structure and are laterally connected to the base region, and the emitter is between a plurality of gate structures.

13. The structure of claim 11, wherein the base region comprises p-SiGe material, and the base region directly contacts a top semiconductor layer comprising silicon.

14. The structure of claim 11, wherein the base region is partially between a buried oxide layer.

15. The structure of claim 14, wherein the emitter and the extrinsic base comprise a semiconductor on insulator (SOI) substrate.

16. The structure of claim 11, wherein the extrinsic base is at ends of the gate structure.

17. The structure of claim 11, wherein the gate structure is a same width as the base region.

18. The structure of claim 11, wherein gate structure is a gate contacted structure forming a four terminal bipolar transistor.

19. The structure of claim 11, further comprising
a second base region above the collector; and
a second gate structure on the second base region;
wherein the emitter is between the gate structure and the second gate structure, and laterally connects to the base region and the second base region.

20. A method comprising:
forming a collector;
forming a base region above the collector;
forming an emitter laterally connecting to the base region;
forming an extrinsic base connecting to the base region; and
forming a gate electrode which includes a bottom surface in direct contact with a top surface of the base region.

* * * * *